United States Patent
Liu et al.

(10) Patent No.: US 11,828,800 B2
(45) Date of Patent: Nov. 28, 2023

(54) METHOD OF PREPARING A SEMICONDUCTOR SPECIMEN FOR FAILURE ANALYSIS

(71) Applicant: MSSCORPS CO., LTD., Hsinchu (TW)

(72) Inventors: Chi-Lun Liu, Hsinchu (TW); Jung-Chin Chen, Hsinchu (TW); Shihhsin Chang, Hsinchu (TW)

(73) Assignee: MSSCORPS CO., LTD., Hsinchu (TW)

( * ) Notice: Subject to any disclaimer, the term of this patent is extended or adjusted under 35 U.S.C. 154(b) by 272 days.

(21) Appl. No.: 17/409,777

(22) Filed: Aug. 23, 2021

(65) Prior Publication Data

US 2022/0155367 A1 May 19, 2022

(30) Foreign Application Priority Data

Nov. 18, 2020 (TW) .................................. 109140323

(51) Int. Cl.
*G01R 31/28* (2006.01)
*H01L 23/00* (2006.01)

(52) U.S. Cl.
CPC .......... *G01R 31/2898* (2013.01); *H01L 24/83* (2013.01); *H01L 2224/83047* (2013.01)

(58) Field of Classification Search
CPC ...... G01R 31/2898; H01L 22/32; H01L 24/83
See application file for complete search history.

(56) References Cited

U.S. PATENT DOCUMENTS

| | | | |
|---|---|---|---|
| 10,978,438 B1* | 4/2021 | Lam ....................... | H01L 22/32 |
| 2003/0181005 A1* | 9/2003 | Hachimine ..... | H01L 21/823828 |
| | | | 438/231 |
| 2006/0051922 A1* | 3/2006 | Huang .............. | H01L 29/66636 |
| | | | 257/E21.415 |
| 2013/0094315 A1* | 4/2013 | Patterson .......... | G11C 29/50008 |
| | | | 365/201 |
| 2016/0020148 A1* | 1/2016 | Song .................. | H01L 21/76816 |
| | | | 438/238 |
| 2016/0111369 A1* | 4/2016 | Or-Bach .................. | H01L 21/84 |
| | | | 257/757 |
| 2022/0328363 A1* | 10/2022 | Chou ................ | H01L 21/76897 |

* cited by examiner

*Primary Examiner* — Omar F Mojaddedi

(57) ABSTRACT

The present invention discloses a method for preparing a semiconductor sample for failure analysis, which is characterized by using an adhesive layer comprising a non-volatile and non-liquid adhesive material with higher adhesion to the dielectric materials and lower adhesion to the metallic contact materials to selectively remove part of the dielectric materials in a large area with high uniformity, but completely remain the metallic contact materials, and not chemically react with the semiconductor specimens or even damage to the structures of interest to be analyzed, and different adhesive materials can be selected as the adhesive layer to control the adhesion to the dielectric layer, thereby the removed thickness of the dielectric layer can be controlled to provide a semiconductor specimen for failure analysis.

9 Claims, 6 Drawing Sheets

METHOD OF PREPARING A SEMICONDUCTOR SPECIMEN FOR FAILURE ANALYSIS

This application claims the benefit of Taiwanese application serial No. 109140323, filed on Nov. 18, 2020, the subject matter of which is incorporated herein by reference.

BACKGROUND OF THE INVENTION

Field of the Invention

The invention relates in general to a method of preparing a semiconductor specimen for failure analysis, and in particular to a method of preparing a semiconductor specimen for failure analysis by means of the adhesion difference of an adhesive material.

Description of the Related Art

Conventional method of preparing a semiconductor specimen for failure analysis is usually proceeded by delayering in sequence to generate a semiconductor specimen. FIGS. 1A~1B are cross-sectional views of a conventional method of preparing a semiconductor specimen for failure analysis. First, as shown in FIG. 1A, a semiconductor sample 10 was provided. The semiconductor sample 10 comprises a semiconductor device 100, a metal contact layer 180 connected to the semiconductor device 100, a first dielectric layer 170 overlaying the semiconductor device 100, a wiring layer 185 formed on the first dielectric layer 170 and connected to the metal contact layer 180 to electrically connected to the semiconductor device 100, and a second dielectric layer 200 overlaying the wiring layer 185. The semiconductor device 100 for example but not limited comprises a semiconductor substrate 110, a gate electrode 120, a gate oxide layer 130, a source electrode 140 and a drain electrode 160. Next, as shown in FIG. 1B, the second dielectric layer 200 and the wiring layer 185 were removed by manual polishing in the presence of a chemical etchant to expose part of the metal contact layer 180 for following failure analysis to find defects underneath. As the cross-sectional views of a conventional method of preparing a semiconductor specimen for failure analysis shown in FIGS. 1A~1B, for a large technology node, the semiconductor device 100 with a thicker dielectric layer will not prone to be damaged during the step of removing the second dielectric layer 200 and the wiring layer 185 by manual polishing in the presence of a chemical etchant, for an advanced technology node, the semiconductor device 100 with a thinner dielectric layer will have a great possibility to be damaged during the step of removing the second dielectric layer 200 and the wiring layer 185 by manual polishing in the presence of a chemical etchant. As shown in FIG. 1B, the defected channel 190 exposing the gate electrode 120 or the defected channel 195 exposing the drain electrode 160 might be formed in the first dielectric layer 170 and the metal contact layer 180 might be damaged during the step of removing the second dielectric layer 200 and the wiring layer 185 by manual polishing in the presence of a chemical etchant, which will result in failure of preparing a semiconductor specimen for failure analysis.

Accordingly, a method of preparing a semiconductor specimen for failure analysis to avoid any damage to the semiconductor device during preparing the semiconductor specimen is highly expected in the semiconductor industry.

SUMMARY OF THE INVENTION

This invention provides a method of preparing a semiconductor specimen for failure analysis, comprising the steps of: providing a semiconductor sample, comprising a semiconductor device, a metal contact layer connected to the semiconductor device, a first dielectric layer overlaying the semiconductor device, a wiring layer formed on the first dielectric layer and connected to the metal contact layer to electrically connected to the semiconductor device, and a second dielectric layer overlaying the wiring layer; polishing the semiconductor sample to gradually remove the second dielectric layer and the wiring layer by using an interface layer between the metal contact layer and the wiring layer as a polishing end point to generate a polished semiconductor sample; forming an adhesive layer on the polished semiconductor sample, wherein the adhesion between the adhesive layer and the first dielectric layer is greater than that between the adhesive layer and the metal contact layer; and curing the adhesive layer and peel off the adhesive layer thereafter to remove part of the first dielectric layer together with the adhesive layer and expose part of the metal contact layer.

The above-mentioned method of preparing a semiconductor specimen for failure analysis, wherein the first dielectric layer and the second dielectric layer are of the same or different materials.

The above-mentioned method of preparing a semiconductor specimen for failure analysis, wherein the first dielectric layer and the second dielectric layer are of the same dielectric materials, and the dielectric materials are majority of silicon dioxide.

The above-mentioned method of preparing a semiconductor specimen for failure analysis, wherein the polishing step is proceeded by manual polishing or mechanical polishing.

The above-mentioned method of preparing a semiconductor specimen for failure analysis, wherein the adhesive layer is a glue layer, a tape, or a wax layer.

The above-mentioned method of preparing a semiconductor specimen for failure analysis, wherein the glue layer or the tape comprises a non-volatile and non-liquid adhesive material.

The above-mentioned method of preparing a semiconductor specimen for failure analysis, wherein the non-volatile and non-liquid adhesive material is silicone.

The above-mentioned method of preparing a semiconductor specimen for failure analysis wherein the thickness of the adhesive layer is ranging between 50~100 μm.

The above-mentioned method of preparing a semiconductor specimen for failure analysis, wherein the step of curing is proceeded by normal temperature-curing, heat-curing, or irradiation-curing.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operation the example. However, the same or equivalent functions and sequences may be accomplished by different examples.

In the following description, numerous specific details are described in detail in order to enable the reader to fully understand the following examples. However, embodiments of the present invention may be practiced in case no such specific details. In other cases, in order to simplify the drawings the structure of the apparatus known only schematically depicted in figures.

Embodiment

Please refer to FIGS. 2A~2D, which illustrate cross-sectional views of a method of preparing a semiconductor specimen for failure analysis according to this present invention.

Figure 1A:
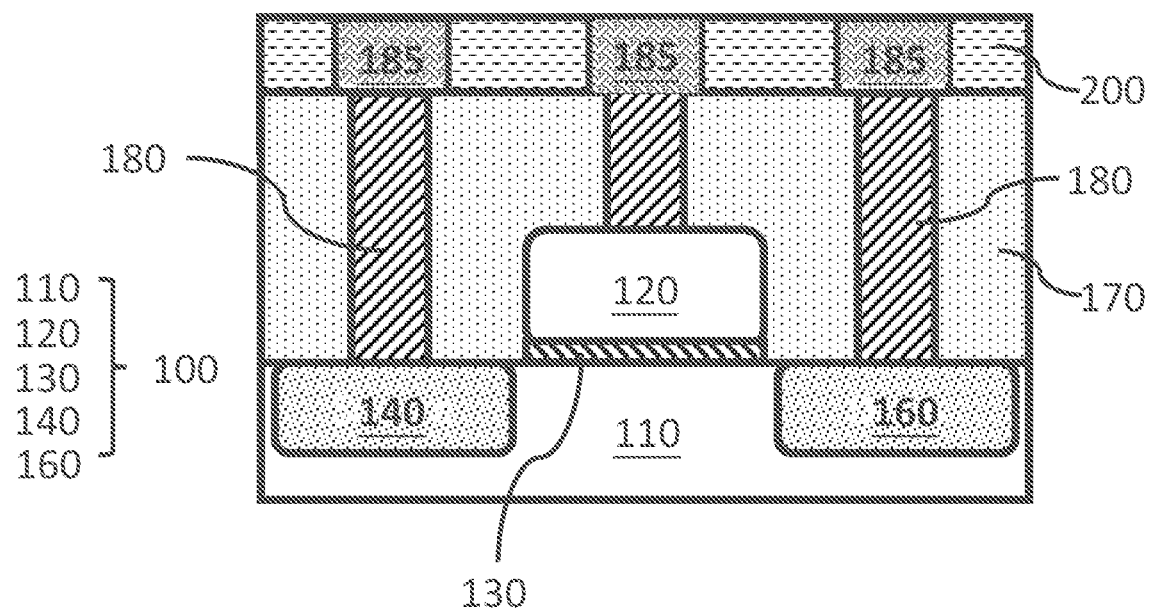
FIGS. 1A~1B are cross-sectional views of a conventional method of preparing a semiconductor specimen for failure analysis.
Figure 1B:
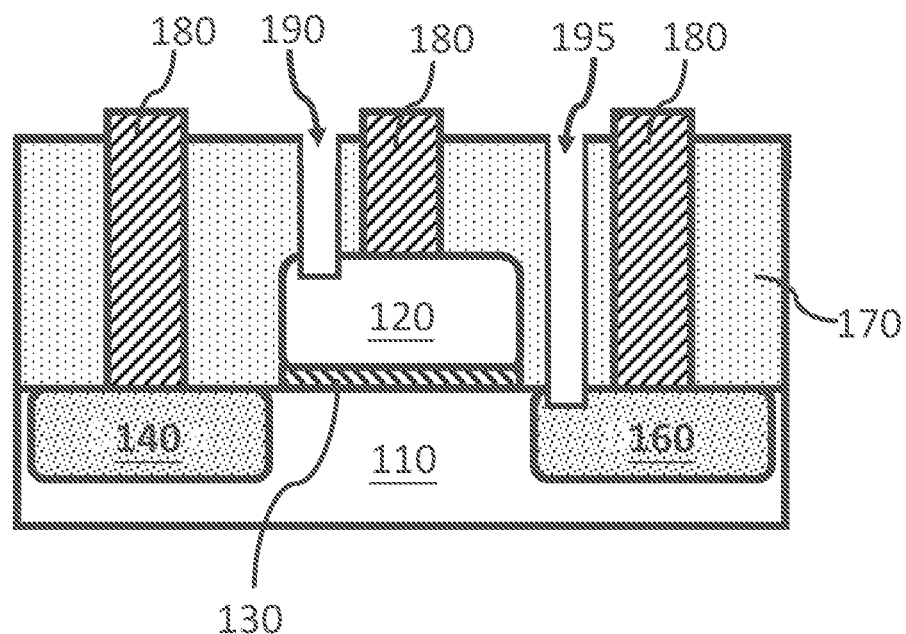
Figure 2A:
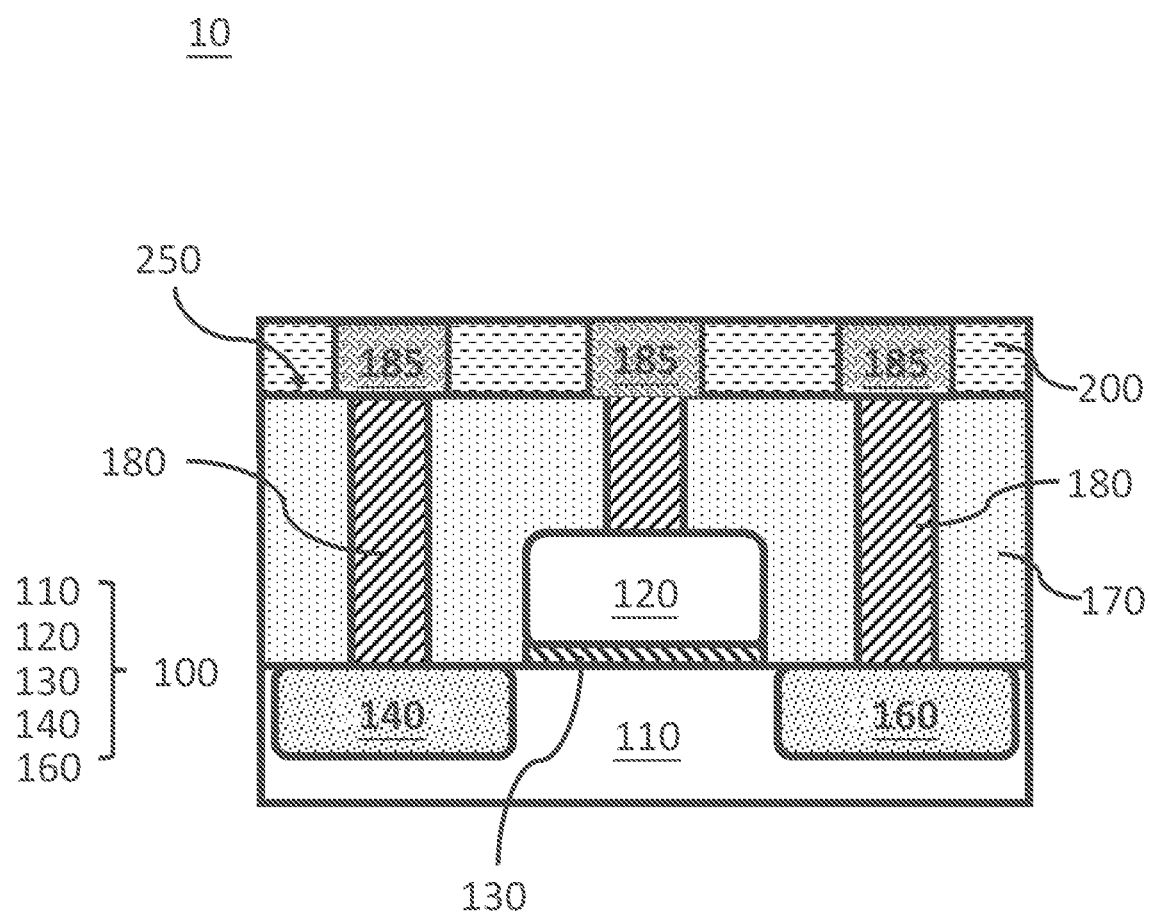
FIGS. 2A~2D are cross-sectional views of a method of preparing a semiconductor specimen for failure analysis according to this present invention.

First, referring to FIG. 2A, a semiconductor sample 10 was provided. The semiconductor sample 10 comprises a semiconductor device 100, a metal contact layer 180 connected to the semiconductor device 100, a first dielectric layer 170 overlaying the semiconductor device 100, a wiring layer 185 formed on the first dielectric layer 170 and connected to the metal contact layer 180 to electrically connected to the semiconductor device 100, and a second dielectric layer 200 overlaying the wiring layer 185. The semiconductor device 100 for example but not limited comprises a semiconductor substrate 110, a gate electrode 120, a gate oxide layer 130, a source electrode 140 and a drain electrode 160. According to this embodiment of this invention, the first dielectric layer 170 and the second dielectric layer 200 can be of the same materials, for example but not limited to silicon dioxide. According to other embodiments of this invention, the first dielectric layer 170 and the second dielectric layer 200 can be formed of other common semiconductor dielectric materials.

Figure 2B:
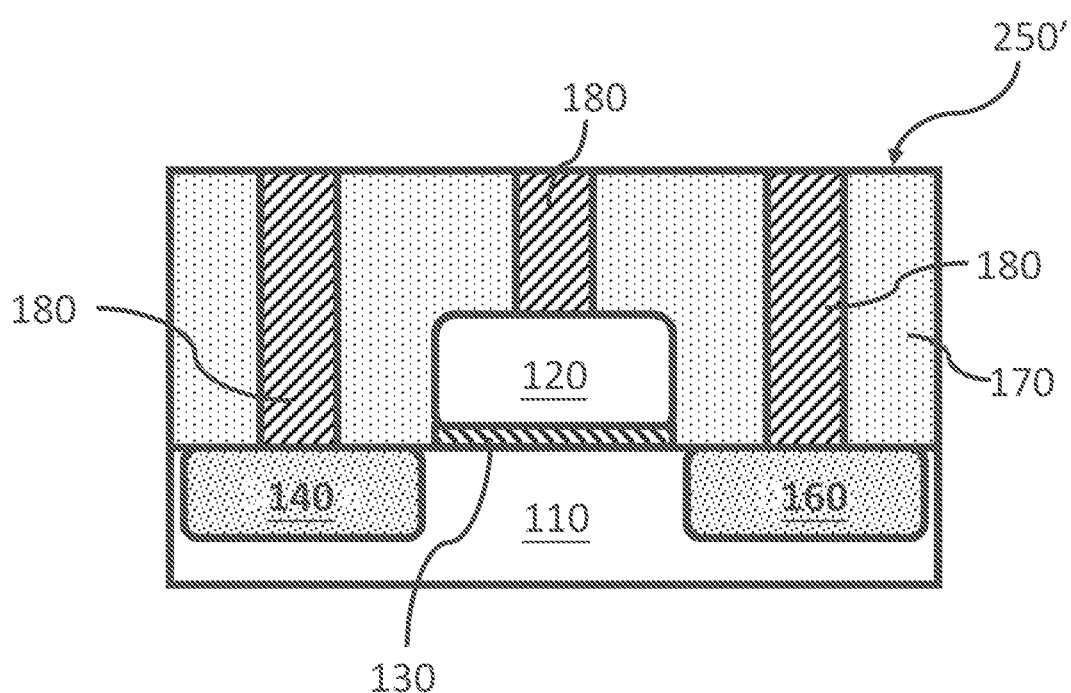

Next, referring to FIG. 2B, the semiconductor sample 10 was polished to gradually remove the second dielectric layer 200 and the wiring layer 185 by using an interface layer 250 between the metal contact layer 180 and the wiring layer 185 as a polishing end point and generate a polished semiconductor sample 10'. According to this embodiment of this invention, the step of polishing can be proceeded by manual polishing or mechanical polishing.

Figure 2C:
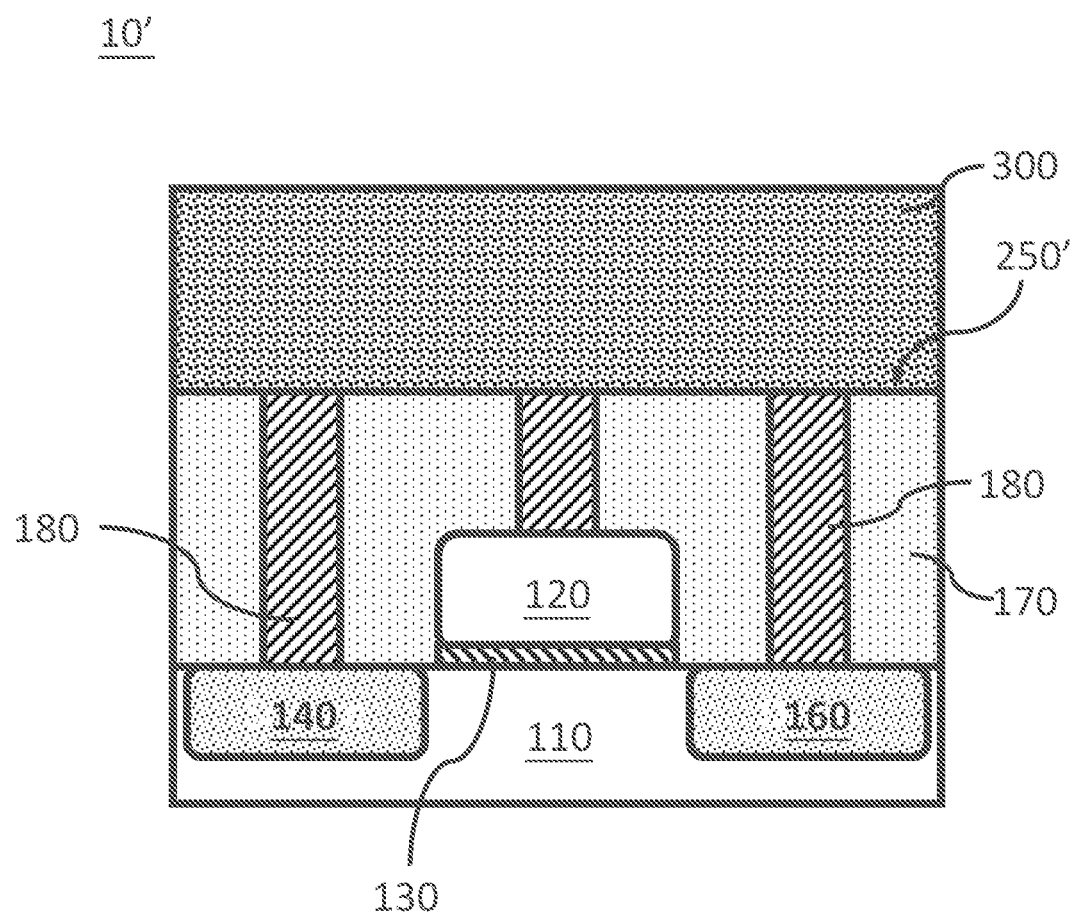

Next, referring to FIG. 2C, an adhesive layer 300 was formed on the polished semiconductor sample 10', wherein the adhesion between the adhesive layer 300 and the first dielectric layer 170 is greater than that between the adhesive layer 300 and the metal contact layer 180. According to this embodiment of this invention, the adhesive layer 300 can be a glue layer, a tape, or a wax layer, and wherein the glue layer or the tape comprises a non-volatile and non-liquid adhesive material, for example but not limited to silicone. According to other embodiments of this invention, other adhesive materials whose adhesions between the adhesive layer 300 and the first dielectric layer 170 are greater that adhesions between the adhesive layer 300 and the metal contact layer 180 can be also applied. Besides, the thickness of the adhesive layer 300 is for example but not limited to ranging between 50~100 μm.

Figure 2D:
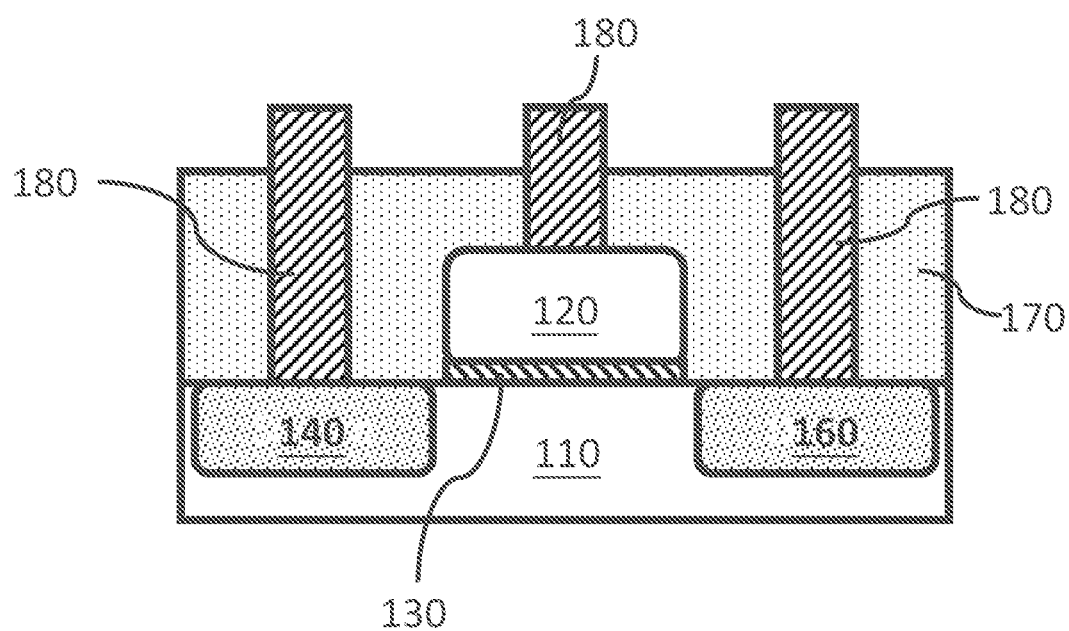

Finally, referring to FIG. 2D, the adhesive layer 300 was cured, and the adhesive layer 300 was peeled off thereafter to remove part of the first dielectric layer 170 together with the adhesive layer 300 and expose part of the metal contact layer 180 to generate a semiconductor specimen 20 for failure analysis. According to this embodiment of this invention, the step of curing can be proceeded by normal temperature-curing, heat-curing, or irradiation-curing.

To sum up, the above-mentioned method of preparing a semiconductor specimen for failure analysis according to this present invention is characterized by using an adhesive layer comprising a non-volatile and non-liquid adhesive material whose adhesion between the adhesive layer and the first dielectric layer greater than that between the adhesive layer and the metal contact layer to selectively and efficiently remove part of the first dielectric layer in large-scale, thereby the metal contact layer can be completely preserved without any chemical reaction or damage caused by the adhesive layer. Besides, the removed thickness of the first dielectric layer can be controlled by selecting an adhesive layer with a desired adhesion between the adhesive layer and the first dielectric layer to generate a suitable semiconductor specimen for failure analysis, especially for advanced technology node semiconductor sample.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. A method of preparing a semiconductor specimen for failure analysis, comprising the steps of:
    providing a semiconductor sample, comprising a semiconductor device, a metal contact layer connected to the semiconductor device, a first dielectric layer overlaying the semiconductor device, a wiring layer formed on the first dielectric layer and connected to the metal contact layer to electrically connected to the semiconductor device, and a second dielectric layer overlaying the wiring layer;
    polishing the semiconductor sample to gradually remove the second dielectric layer and the wiring layer by using an interface layer between the metal contact layer and the wiring layer as a polishing end point to generate a polished semiconductor sample;
    forming an adhesive layer on the polished semiconductor sample, wherein the adhesion between the adhesive layer and the first dielectric layer is greater than that between the adhesive layer and the metal contact layer; and
    curing the adhesive layer and peel off the adhesive layer thereafter to remove part of the first dielectric layer together with the adhesive layer and expose part of the metal contact layer.

2. The method of preparing a semiconductor specimen for failure analysis as claimed in claim 1, wherein the first dielectric layer and the second dielectric layer are of the same or different materials.

3. The method of preparing a semiconductor specimen for failure analysis as claimed in claim 1, wherein the first dielectric layer and the second dielectric layer are of the same dielectric materials, and the dielectric materials are majority of silicon dioxide.

4. The method of preparing a semiconductor specimen for failure analysis as claimed in claim 1, wherein the polishing step is proceeded by manual polishing or mechanical polishing.

5. The method of preparing a semiconductor specimen for failure analysis as claimed in claim 1, wherein the adhesive layer is a glue layer, a tape, or a wax layer.

6. The method of preparing a semiconductor specimen for failure analysis as claimed in claim 5, wherein the glue layer or the tape comprises a non-volatile and non-liquid adhesive material.

7. The method of preparing a semiconductor specimen for failure analysis as claimed in claim 6, wherein the non-volatile and non-liquid adhesive material is silicone.

8. The method of preparing a semiconductor specimen for failure analysis as claimed in claim 1, wherein the thickness of the adhesive layer is ranging between 50~100 μm.

9. The method of preparing a semiconductor specimen for failure analysis as claimed in claim 1, wherein the step of curing is proceed by normal temperature-curing, heat-curing, or irradiation-curing.

\* \* \* \* \*